(12) United States Patent
Kang et al.

(10) Patent No.: US 8,030,987 B2
(45) Date of Patent: Oct. 4, 2011

(54) LEVEL SHIFTER CIRCUIT AND SEMICONDUCTOR DEVICE HAVING THE SAME

(75) Inventors: Yong-Gu Kang, Gyeonggi-do (KR); Choung-Ki Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/756,772

(22) Filed: Apr. 8, 2010

(65) Prior Publication Data

US 2011/0204953 A1 Aug. 25, 2011

(30) Foreign Application Priority Data

Feb. 24, 2010 (KR) .................. 10-2010-0016843

(51) Int. Cl.
*H03L 5/00* (2006.01)
(52) U.S. Cl. ....................................... 327/333
(58) Field of Classification Search ............ 327/333
See application file for complete search history.

(56) References Cited

U.S. PATENT DOCUMENTS

| | | | |
|---|---|---|---|
| 6,614,283 B1 * | 9/2003 | Wright et al. | 327/333 |
| 6,803,801 B2 * | 10/2004 | Randazzo et al. | 327/333 |
| 7,183,817 B2 * | 2/2007 | Sanchez et al. | 327/112 |
| 7,310,012 B2 * | 12/2007 | Chen | 327/333 |
| 7,541,837 B2 * | 6/2009 | Lines | 326/68 |
| 2008/0315936 A1 * | 12/2008 | Mauthe et al. | 327/333 |

* cited by examiner

*Primary Examiner* — Lincoln Donovan
*Assistant Examiner* — Khareem E Almo
(74) *Attorney, Agent, or Firm* — IP & T Group LLP

(57) ABSTRACT

A level shifter circuit includes a pull-up unit configured to pull up an output node to a second voltage level being higher than a first voltage level in response to an input signal swinging with an amplitude of the first voltage level, a pull-down unit configured to pull down the output node in response to the input signal, and a protection unit connected between the output node and the pull-down unit to prevent a voltage of the output node from being applied to the pull-down unit.

2 Claims, 3 Drawing Sheets

LEVEL SHIFTER CIRCUIT AND SEMICONDUCTOR DEVICE HAVING THE SAME

CROSS-REFERENCE TO RELATED APPLICATIONS

The present application claims priority of Korean Patent Application No. 10-2010-0016843, filed on Feb. 24, 2010, which is incorporated herein by reference in its entirety.

BACKGROUND OF THE INVENTION

Exemplary embodiments of the present invention relate to a semiconductor device, and more particularly, to a semiconductor device having a level shifter circuit.

Generally, semiconductor ICs (e.g., semiconductor memory devices) are not supplied with all operating voltages from the outside, but rather are supplied with only typical operating voltages, such as a power supply voltage (VDD), a ground voltage (VSS), etc. Therefore, semiconductor ICs may be provided with internal voltage generators to generate various levels of driving voltages.

In semiconductor ICs, the voltage swing levels may be different from one another within blocks that perform the same function. Specifically, the swing level of an input signal may be different from that of an output signal.

In this regard, a circuit configured to shift a swing level of an input signal is commonly referred to as a level shifter. A level shifter may be used to lower the swing level of an input signal, and is also widely used to boost the voltage level of an input signal. A semiconductor memory device may include a level shifter configured to shift the swing level of a signal swinging between a ground voltage (VSS) and a power supply voltage (VDD) and output a signal swinging between a ground voltage (VSS) and a high voltage (VPP).

FIG. 1 illustrates a conventional level shifter circuit.

Referring to FIG. 1, the conventional level shifter circuit includes an inverter INV1, an NMOS transistor TN1, an NMOS transistor SN1, a PMOS transistor TP1, a PMOS transistor TP2, and an inverter INV2. The inverter IV1 is configured to invert an input signal IN. The NMOS transistor TN1 has a gate connected to an output terminal A1 of the inverter INV1, a source connected to a ground voltage (VSS) terminal, and a drain connected to a node A3. The NMOS transistor SN1 has a gate connected to a power supply voltage (VDD) terminal, a source connected to a node A1, and a drain connected to a node A2. The PMOS transistor TP1 has a source connected to a high voltage (VPP) terminal, a drain connected to the node A2, and a gate connected to the node A3. The PMOS transistor TP2 has a source connected to the high voltage (VPP) terminal, a drain connected to the node A3, and a gate connected to the node A2. The inverter INV2 is configured to invert a signal of the node A3 and output the inverted signal as an output signal OUT.

The inverter INV1 uses the power supply voltage VDD as its pull-up voltage, and the inverter INV2 uses the high voltage VPP as its pull-up voltage. That is, the input signal IN swings between the ground voltage VSS and the power supply voltage VDD, and the output signal OUT swings between the ground voltage VSS and the high voltage VPP.

The operation of the conventional level shifter circuit will now be described briefly.

In one case, when the input signal IN has a logic high level (corresponding to the VDD level), the node A1 has the ground voltage (VSS) level. In this case, since the power supply voltage (VDD) level is applied to the gate of the NMOS transistor SN1, the NMOS transistor SN1 is turned on. Thus, the node A2 approaches the ground voltage (VSS) level, and the PMOS transistor TP2 is turned on. Since the NMOS transistor TN1 is in a turned-off state, the node A3 has the high voltage (VPP) level, and the PMOS transistor TP1 is turned off, thereby preventing an increase in the voltage level of the node A2. The resulting output signal OUT has a logic low level (corresponding to the VSS level).

On the other hand, when the input signal IN has a logic low level (corresponding to the VSS level), the node A1 has the power supply voltage (VDD) level. As a result, the NMOS transistor TN1 is turned on so that the node A3 is discharged. When the voltage level of the node A3 drops below the threshold voltage (Vt) of the PMOS transistor TP1, the PMOS transistor TP1 is turned on and drives the node A2 to the high voltage (VPP) level. Since the NMOS transistor SN1 is in a turned-off state, the PMOS transistor TP2 is turned off when the voltage level of the node A2 increases above the threshold voltage, thereby preventing the increase in the voltage level of the node A3. The resulting output signal OUT has a logic high level corresponding to the high voltage (VPP) level.

Meanwhile, since the high voltage VPP is applied to the PMOS transistors TP1 and TP2, the PMOS transistors TP1 and TP2 are implemented with thick transistors, which have a large gate insulation film thickness (Tox), in order to guarantee the reliability of the semiconductor device. The NMOS transistor SN1 is implemented with a slim transistor, which has excellent current driving capability and a low threshold voltage. Since the high voltage VPP may be applied to the drain of the NMOS transistor TN1, the NMOS transistor TN1 is also implemented with a thick transistor, which has a large gate insulation film thickness (Tax).

In the case of DRAMs, there is no great difference in the versions of the DRAMs. However, the power supply voltage (VDD) level tends to be gradually lowered in order to meet the low power requirement. Specifically, the power supply voltage (VDD) level has been lowered as the version of DRAMs have evolved (e.g., DDR1 (2.5 V), DDR2 (1.8 V), DDR3 (1.5 V), DDR4 (1.2 V-1.0 V)). However, there has been almost no difference in the high voltage (VPP) level, which has been in a range of 3.3 V to 3.0 V.

Such a trend towards a dropping power supply voltage VDD and an increasing high voltage VPP causes unstable operation of the level shifter circuit as illustrated in FIG. 2. FIG. 2 is a timing diagram showing input/output waveforms of the conventional level shifter circuit of FIG. 1 in a low power supply voltage environment (e.g., VDD=0.94 V) for various voltage levels of high voltage VPP. It is clear from FIG. 2 that the operation slows down when the level shifter circuit is enabled, and the voltage level is not fully pulled down to the ground voltage VSS when the level shifter circuit is disabled.

This result occurs for the following reason. The NMOS transistor TN1, which is configured to pull down the output node A3 of the conventional level shifter circuit, has a large gate insulation film thickness and a high threshold voltage. Therefore, as the logic high level (corresponding to the VDD level) of the node A1 is lowered, a longer time is taken to turn on the NMOS transistor TN1 so that the output node A3 is discharged to the ground voltage (VSS) level. When the power supply voltage (VDD) level drops even further, the current driving capability of the NMOS transistor TN1 becomes lower than that of the PMOS transistor TP2. As a result, the output node A3 fails to be sufficiently driven to the ground voltage (VSS) level.

Meanwhile, when the input signal IN having a logic low level is inputted in an environment where the power supply voltage VDD drops gradually, the logic level of the node A1 changes to a logic high level and a voltage equivalent to the power supply voltage minus the threshold voltage (VDD−Vt) is applied to the node A2. The lowered gate voltage of the NMOS transistor TN1 (also the voltage of node A1) reduces the amount of current flowing through the NMOS transistor TN1. Therefore, due to the operations of the PMOS transistors TP1 and TP2, which are cross-coupled to pull up the output node A3 to the high voltage (VPP) level, the output node A3 cannot be fully pulled down to a logic low level. Hence, the operation of charging the node A2 to the high voltage (VPP) level is hindered. This increases the delay in which the output node A3 changes from the high voltage (VPP) level to the ground voltage (VSS) level, and also increases the delay until the output signal OUT changes from the transition time point of the input signal IN. When the low power supply voltage (VDD) environment is severe, the amount of change of the output node A3 when the NMOS transistor TN1 is turned on becomes too small to control the PMOS transistor TP1. In this case, since the node A2 also fails to change from a logic low level to a high voltage (VPP) level, the PMOS transistor TP2 fails to be turned off. Thus, the output node A3 fails to change to a level which is recognizable as a logic low level. Consequently, the output signal OUT does not have a required output level.

FIG. 3 illustrates another conventional level shifter circuit.

The level shifter circuit of FIG. 3 is designed to overcome the above-mentioned concerns regarding the level shifter circuit of FIG. 1 which occur in the low power supply voltage (VDD) environment. Compared with the level shifter circuit of FIG. 1, the level shifter circuit of FIG. 3 further includes an inverter INV11 and MOS transistors TN11, TN12, TN13, and TN14, and the gate insulation film thicknesses of some transistors are modified.

For reference, PMOS transistors TP11 and TP12 and NMOS transistors TN11, TN12, TN13, and TN14 are implemented with thick transistors having a large gate insulation film thickness, and NMOS transistors SN11 and SN12 are implemented with slim transistors.

Since the basic operation of the level shifter circuit of FIG. 3 is substantially identical to that of the level shifter circuit of FIG. 1, a description thereof will be omitted for conciseness.

The proposed level shifter circuit may address the above-mentioned operational concerns of the level shifter circuit of FIG. 1 which occur in the low power supply voltage (VDD) environment, but is its circuit area is at least doubled by the increase in the number of transistors used therein. In addition, when the NMOS transistors TN13 and TN14 are turned on, the high voltage VPP is applied to the NMOS transistors SN11 and SN12 which are implemented with the slim transistors. This may degrade the reliability of the semiconductor device.

SUMMARY OF THE INVENTION

Exemplary embodiments of the present invention are directed to a level shifter circuit capable of guaranteeing output operation characteristics in a low power supply voltage environment without increasing the circuit area.

In accordance with an embodiment of the present invention, a level shifter circuit includes a pull-up unit configured to pull up an output node to a second voltage level higher than a first voltage level in response to an input signal swinging with an amplitude of the first voltage level, a pull-down unit configured to pull down the output node in response to the input signal, and a protection unit connected between the output node and the pull-down unit to prevent a voltage of the output node from being applied to the pull-down unit.

In accordance with another embodiment of the present invention, a level shifter circuit includes a first inverter configured to invert an input signal swinging with an amplitude of a first voltage level, a first NMOS transistor having a gate connected to an output terminal of the first inverter and a source connected to a base voltage terminal, a second NMOS transistor having a source connected to a drain of the first NMOS transistor, a drain connected to an output node, and a gate connected to a voltage supply terminal supplying a logic high level, a third NMOS transistor having a gate connected to the voltage supply terminal supplying the logic high level and a source connected to the output terminal of the first inverter, a first PMOS transistor having a source connected to a second voltage supply terminal supplying a second voltage level higher than the first voltage level, a drain connected to a drain of the third NMOS transistor, and a gate connected to the output node, a second PMOS transistor having a source connected to the second voltage supply terminal, a drain connected to the output node, and a gate connected to the drain of the first PMOS transistor, and a second inverter configured to invert a signal of the output node and drive the inverted signal as an output signal.

In accordance with yet another embodiment of the present invention, a semiconductor device includes a pull-up unit configured to pull up an output node to a second voltage level higher than a first voltage level in response to an input signal swinging with an amplitude of the first voltage level, a pull-down unit configured to pull down the output node in response to the input signal, and a protection unit connected between the output node and the pull-down unit to prevent a voltage of the output node from being applied to the pull-down unit.

DESCRIPTION OF SPECIFIC EMBODIMENTS

Figure 1:
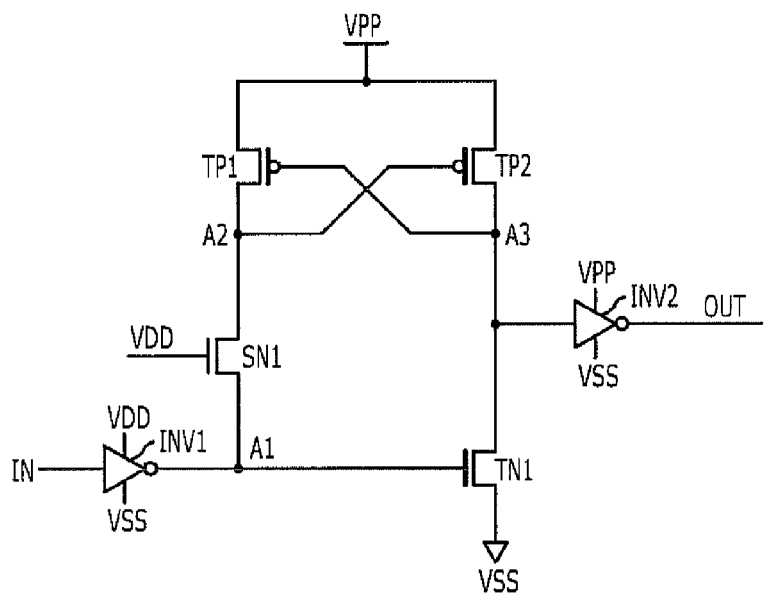
FIG. 1 illustrates a conventional level shifter circuit.
Figure 2:
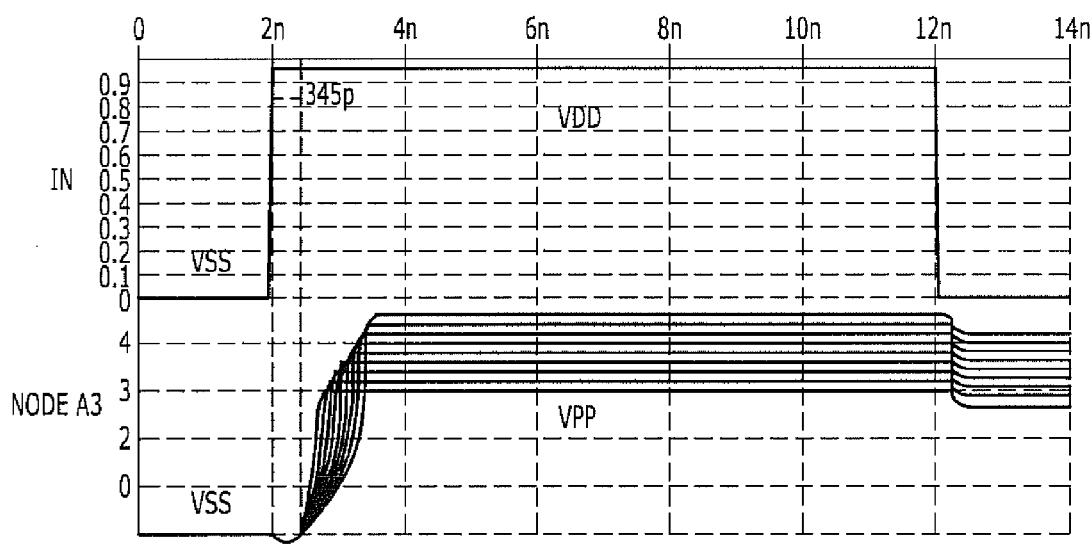
FIG. 2 is a timing diagram showing input/output waveforms of the conventional level shifter circuit of FIG. 1 in a low power supply voltage environment (e.g., VDD=0.94 V).
Figure 3:
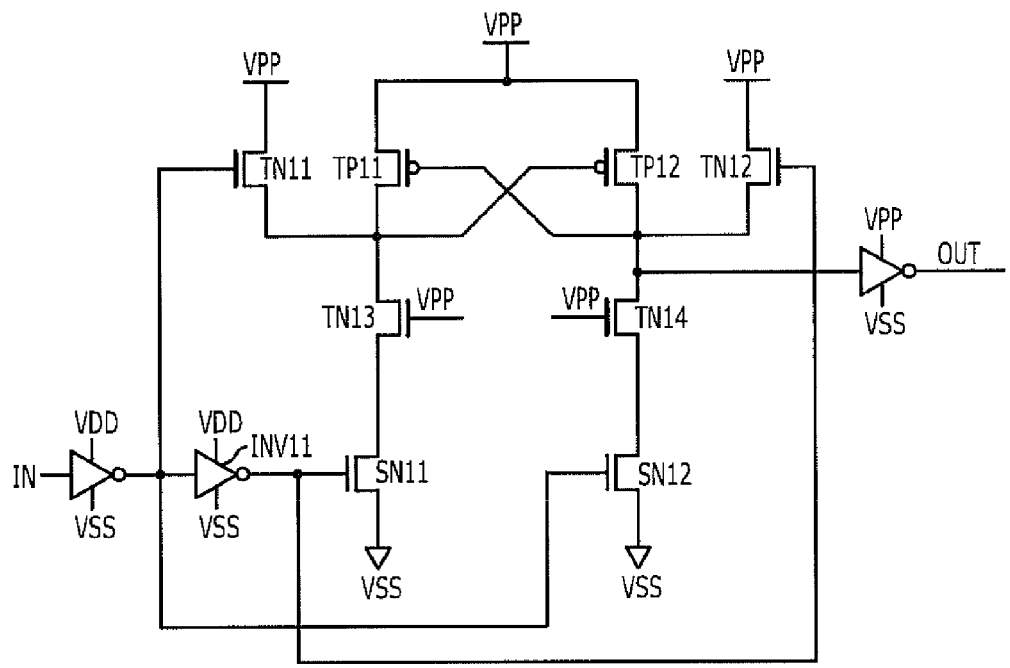
FIG. 3 illustrates another conventional level shifter circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
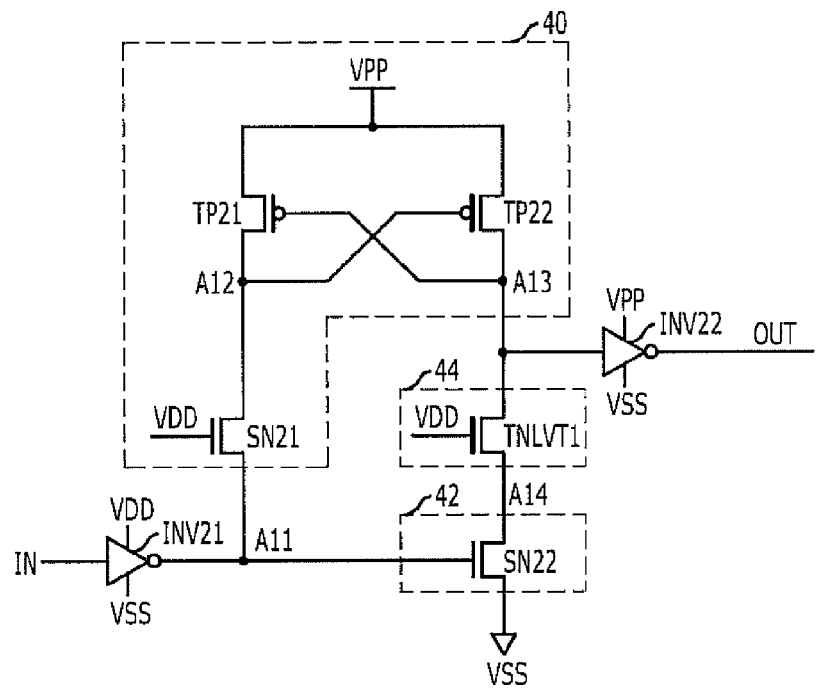
FIG. 4 illustrates a level shifter circuit in accordance with an embodiment of the present invention.

FIG. 4 illustrates a level shifter circuit in accordance with an embodiment of the present invention.

Referring to FIG. 4, the level shifter circuit in accordance with the embodiment of the present invention includes a pull-up unit 40, a pull-down unit 42, and a protection unit 44. The pull-up unit 40 is configured to pull up an output node A13 to a high voltage (VPP) level, which is higher than a power supply voltage (VDD) level, in response to an input signal IN, which swings with an amplitude of the power supply voltage (VDD) level. The pull-down unit 42 is configured to pull down the output node A13 in response to the input signal IN. The protection unit 44 is connected between the output node A13 and the pull-down unit 42 and configured to prevent a voltage of the output node A13 from being directly applied to the pull-down unit 42.

The level shifter circuit may further include an inverter INV21 and an inverter INV22. Although inverter INV21 and inverter INV22 are shown in FIG. 4, they may not be included in other exemplary embodiments of the level shifter circuit. As shown in FIG. 4, the inverter INV21 is configured to invert the input signal IN and transfer the inverted input signal to a node A11, and the inverter INV22 is configured to invert a signal of the output node A13 and output the inverted signal as an output signal OUT. The inverter INV21 uses the power supply voltage VDD as its pull-up voltage, and the inverter INV22 uses the high voltage VPP as its pull-up voltage. Furthermore, both the inverter INV21 and the inverter INV22 use the ground voltage as their pull-down voltage.

The pull-up unit 40 includes an NMOS transistor SN21, a PMOS transistor TP21, and a PMOS transistor TP22. The NMOS transistor SN21 has a gate connected to the power supply voltage (VDD) terminal, a source connected to a node A11 coupled to the output terminal of the inverter INV21, and a drain connected to a node A12. The PMOS transistor TP21 has a source connected to the high voltage (VPP) terminal, a drain connected to the node A12, and a gate connected to the node A13. The PMOS transistor TP22 has a source connected to the high voltage (VPP) terminal, a drain connected to the node A13, and a gate connected to the node A12.

The PMOS transistors TP21 and TP22 are implemented with thick transistors having a large gate insulation film thickness, and the NMOS transistor SN21 is implemented with a slim transistor.

The pull-down unit 42 includes an NMOS transistor SN22 having a gate connected to the node A11, a source connected to a ground voltage (VSS) terminal, and a drain connected to a node A14. Further, the NMOS transistor SN22 is implemented with a slim transistor.

The protection unit 44 may include an NMOS transistor TNLVT1 having a gate connected to the power supply voltage (VDD) terminal, a source connected to the node A14, and a drain connected to the node A13.

When the input signal IN has a logic high level (VDD level), the node A11 becomes the ground voltage (VSS) level. In this case, since the gate of the NMOS transistor SN21 has the power supply voltage (VDD) level, the NMOS transistor SN21 is turned on. Thus, the node A12 approaches the ground voltage (VSS) level, and the PMOS transistor TP22 is turned on. Since the NMOS transistor SN22 is in a turned-off state, the output node A13 has the high voltage (VPP) level, and the PMOS transistor TP21 is turned off, thereby preventing the increase in the voltage level of the node A12. The resulting output signal OUT has a logic low level (VSS level).

On the other hand, when the input signal IN has a logic low level (VSS level), the node A11 has the power supply voltage (VDD) level. As a result, the NMOS transistor SN22 is turned on so that the node A14 is discharged. When the voltage level of the node A14 is sufficiently lowered, the NMOS transistor TNLVT1, having the power supply voltage VDD applied at its gate, is turned on and establishes a discharge path for the output node A13. Meanwhile, since the NMOS transistor SN21 is in a turned-off state, the PMOS transistor TP22 is turned on when the voltage level of the node A12 increases above the threshold voltage, thereby preventing the increase in the voltage level of the output node A13. The resulting output signal OUT has a logic high level corresponding to the high voltage (VPP) level.

As mentioned above, the NMOS transistor SN22 of the pull-down unit 42 is implemented with a slim transistor having a low threshold voltage (Vt), a small gate insulation film thickness (Tax), and excellent current driving capability, and the NMOS transistor TNLVT1 of the protection unit 44 is implemented with a thick transistor having a low threshold voltage (Vt) and a large gate insulation film thickness (Tax). The resistance of the path which is established from the output node A13 to the ground voltage (VSS) terminal when the NMOS transistor SN22 is turned on (i.e., the turn-on resistance of the NMOS transistors SN22 and TNLVT1) is smaller than that of the NMOS transistor TN1 of FIG. 1.

This enhances the capability of pulling down the output node A13 when the node A11 is at the power supply voltage (VDD) level. In other words, the output node A13 may be fully pulled down to the ground voltage (VSS) level. Meanwhile, the NMOS transistor TNLVT1 of the protection unit 44 is configured so that, even if the high voltage VPP is applied to the output node A13, a voltage equivalent to the power supply voltage VDD minus the threshold voltage Vt (i.e., VDD-Vt) is always applied to the node A14. Hence, the NMOS transistor SN22 implemented with a slim transistor is protected.

Figure 5:
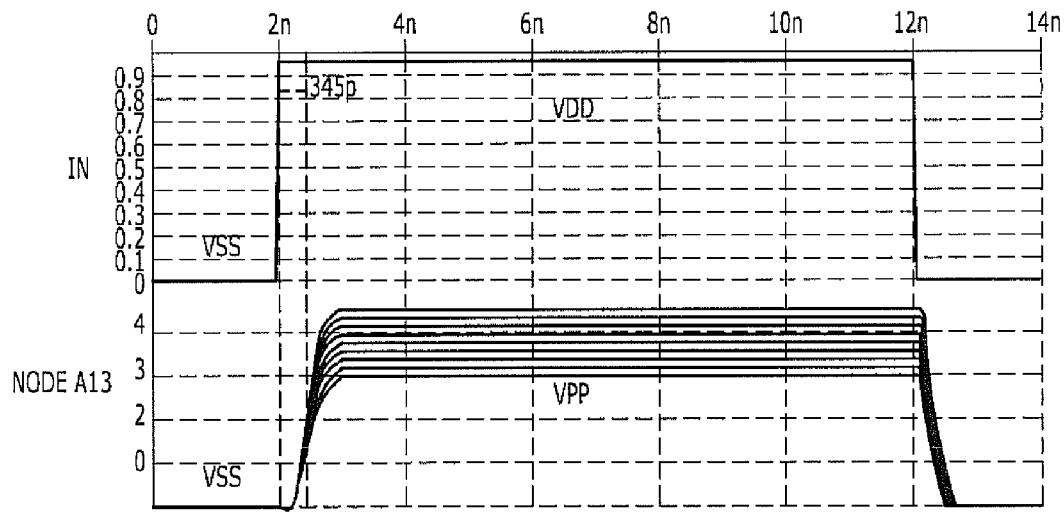
FIG. 5 is a timing diagram showing input/output waveforms of the level shifter circuit of FIG. 4 in a low power supply voltage environment (e.g., VDD=0.94 V).

FIG. 5 is a timing diagram showing input/output waveforms of the level shifter circuit of FIG. 4 in a low power supply voltage (VDD) environment (e.g., VDD=0.94 V) for various voltage levels of high voltage VPP. It is clear from FIG. 5 that it is possible to address concerns surrounding the prior art that the operation slows down when the level shifter circuit is enabled, and the voltage level at an output node is not fully pulled down to the ground voltage VSS when the level shifter circuit is disabled.

Figure 6:
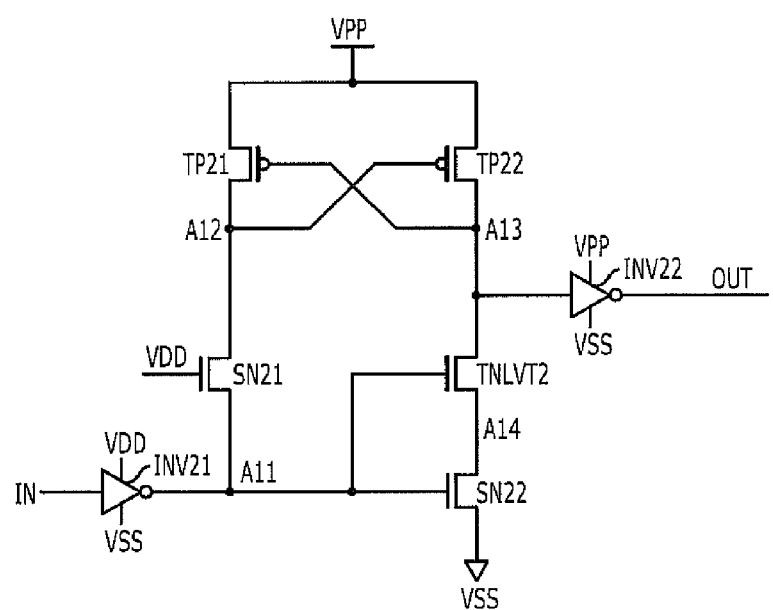
FIG. 6 illustrates a level shifter circuit in accordance with another embodiment of the present invention.

FIG. 6 illustrates a level shifter circuit in accordance with another embodiment of the present invention.

The level shifter circuit of FIG. 6 has substantially the same construction as the level shifter circuit of FIG. 4, except for the protection unit 44.

To be specific, the gate of the NMOS transistor TNLVT1 of the protection unit 44 illustrated in FIG. 4 is directly connected to the power supply voltage (VDD) terminal, whereas the gate of the NMOS transistor TNLVT2 illustrated in FIG. 6 is connected to the node A11. Such modification makes no difference in operation because the NMOS transistor TNLVT2 functions only when the node A11 is at the power supply voltage (VDD) level. The NMOS transistor TNLVT2 is implemented with a thick transistor, which has a low threshold voltage (Vt) and a large gate insulation film thickness (Tox).

As mentioned above, the protection unit is inserted between the pull-down unit, which pulls down the output node in response to the input signal, and the output node in the level shifter circuit, so as to prevent the voltage of the output node from being directly applied to the pull-down unit. In this case, the pull-down unit may be implemented with a slim MOS transistor. As a result, output operation characteristics of the level shifter circuit are guaranteed even in a low power supply voltage (VDD) environment, while minimizing the addition of circuits.

While the present invention has been described with respect to the specific embodiments, it will be apparent to those skilled in the art that various changes and modifications may be made without departing from the spirit and scope of the invention as defined in the following claims.

For example, although it has been assumed in the description of the foregoing embodiments that the power supply voltage VDD is applied to the gates of the NMOS transistors SN21 and TNLVT1, a voltage slightly higher or lower than the power supply voltage VDD, taking into consideration the threshold voltage, may be used without harming the operation of the level shifter circuit.

Furthermore, the power supply voltage VDD being the input voltage level or the high voltage VPP being the output voltage level adopted in the foregoing embodiments is merely a representative case, and the present invention is equally applicable even if different voltages are used.

In addition, although it has been assumed in the description of the foregoing embodiments that the ground voltage VSS is used as the base voltage, no operation problem occurs even if a voltage slightly higher or lower than the ground voltage VSS is used instead.

What is claimed is:

1. A level shifter circuit comprising:
a pull-up unit configured to pull up an output node to a second voltage level higher than a first voltage level in response to an input signal swinging with an amplitude of the first voltage level;
a pull-down unit configured to pull down the output node in response to the input signal; and
a protection unit coupled between the output node and the pull-down unit to prevent a voltage of the output node from being applied to the pull-down unit,
wherein the pull-down unit comprises a first NMOS transistor having a gate receiving the input signal and a source coupled to a base voltage terminal,
wherein the protection unit comprises a second NMOS transistor having a source coupled to a drain of the first NMOS transistor, a drain coupled to the output node, and a gate supplied with the input signal,
wherein the first NMOS transistor is implemented with a slim transistor having a gate insulation film thickness smaller than the second NMOS transistor,
wherein the base voltage terminal is a ground voltage terminal, the first voltage level corresponds to a power supply voltage, and the second voltage level corresponds to a higher-level voltage.

2. A semiconductor device comprising:
a pull-up unit configured to pull up an output node to a second voltage level higher than a first voltage level in response to an input signal swinging with an amplitude of the first voltage level;
a pull-down unit configured to pull down the output node in response to the input signal; and
a protection unit coupled between the output node and the pull-down unit to prevent a voltage of the output node from being applied to the pull-down unit,
wherein the pull-down unit comprises a first NMOS transistor having a gate receiving the input signal and a source coupled to a base voltage terminal,
wherein the protection unit comprises a second NMOS transistor having a source coupled to a drain of the first NMOS transistor, a drain coupled to the output node, and a gate supplied with the input signal,
wherein the first NMOS transistor is implemented with a slim transistor having a gate insulation film thickness smaller than the second NMOS transistor,
wherein the base voltage terminal is a ground voltage terminal, the first voltage level corresponds to a power supply voltage, and the second voltage level corresponds to a higher-level voltage.

* * * * *